US012669853B2

(12) United States Patent
Chen et al.

(10) Patent No.:    US 12,669,853 B2
(45) Date of Patent:        Jun. 30, 2026

(54) SYSTEMS AND METHODS FOR CONTROLLING LEAKS IN LIQUID COOLING SYSTEMS FOR COMPUTER DEVICES

(71) Applicant: Quanta Computer Inc., Taoyuan City (TW)

(72) Inventors: Chao-Jung Chen, Taoyuan City (TW); Yu-Nien Huang, Taoyuan City (TW); Sin-Hong Lien, Taoyuan City (TW); Jen-Mao Chen, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 376 days.

(21) Appl. No.: 18/496,828

(22) Filed: Oct. 27, 2023

(65) Prior Publication Data

US 2024/0053805 A1     Feb. 15, 2024

Related U.S. Application Data

(62) Division of application No. 17/514,479, filed on Oct. 29, 2021, now Pat. No. 11,868,189.

(Continued)

(51) Int. Cl.
*H05K 7/20*         (2006.01)
*G06F 1/02*         (2006.01)
*G06F 1/20*         (2006.01)

(52) U.S. Cl.
CPC ................. *G06F 1/20* (2013.01); *G06F 1/02* (2013.01); *H05K 7/20272* (2013.01);
(Continued)

(58) Field of Classification Search
USPC ........................................................ 700/300
See application file for complete search history.

(56) References Cited

U.S. PATENT DOCUMENTS 10,098,258 B2    10/2018  Chainer et al.
10,729,039 B2     7/2020  Shelnutt et al.
(Continued)

FOREIGN PATENT DOCUMENTS

CN        110446396 A     11/2019
CN        112533438 A     3/2021

OTHER PUBLICATIONS

TW Office Action for Application No. 111113653, mailed Dec. 20, 2022, w/ First Office Action Summary, 12 pp.
(Continued)

*Primary Examiner* — Emilio J Saavedra
(74) *Attorney, Agent, or Firm* — Nixon Peabody LLP

(57)                ABSTRACT

A method and system controls cooling system leaks in a rack. The method includes monitoring leak detection sensors positioned at computer systems and below sections of a liquid conveyance system. In response to determining if a signal was received from one of the leak detection sensors that is indicative of a leak, the leak detection sensor and the corresponding one of the plurality of computer systems associated the received signal is determined. Power is disconnected to the corresponding one of the computer systems and a signal is transmitted to implement moving first and second valves from open to closed positions. The first valve is positioned within the liquid conveyance system between a hot rack manifold and a thermal contact structure associated with the computer system associated with the received signal. The second valve is positioned within the liquid conveyance system between a cool rack manifold and the thermal contact structure.

20 Claims, 5 Drawing Sheets

Related U.S. Application Data

(60) Provisional application No. 63/260,816, filed on Sep. 1, 2021.

(52) U.S. Cl.
CPC ... *H05K 7/20281* (2013.01); *G06F 2200/201* (2013.01); *H05K 7/20781* (2013.01)

(56) References Cited

U.S. PATENT DOCUMENTS

| | | | |
|---|---|---|---|
| 2011/0313576 A1 | 12/2011 | Nicewonger | |
| 2012/0147553 A1 | 6/2012 | Eriksen | |
| 2016/0270259 A1* | 9/2016 | Chainer | H05K 7/20272 |
| 2016/0273996 A1 | 9/2016 | Alshinnawi et al. | |
| 2017/0181329 A1* | 6/2017 | Shelnutt | H05K 7/20781 |
| 2017/0245398 A1 | 8/2017 | Hayashi et al. | |
| 2020/0093033 A1* | 3/2020 | Lunsman | G01M 3/2815 |
| 2021/0084796 A1 | 3/2021 | Gao | |
| 2022/0369518 A1* | 11/2022 | Gao | H05K 7/20272 |
| 2022/0390195 A1 | 12/2022 | Gao | |
| 2022/0404079 A1* | 12/2022 | Franz | H05K 7/20781 |
| 2022/0408596 A1* | 12/2022 | Gao | H05K 7/20281 |
| 2023/0067321 A1 | 3/2023 | Gao | |

OTHER PUBLICATIONS

TW Search Report for Application No. 111113653, mailed Dec. 20, 2022, w/ First Office Action, 1 p.

* cited by examiner

SYSTEMS AND METHODS FOR CONTROLLING LEAKS IN LIQUID COOLING SYSTEMS FOR COMPUTER DEVICES

CROSS-REFERENCE TO RELATED APPLICATIONS

This application is a divisional of U.S. patent application Ser. No. 17/514,479, filed on Oct. 29, 2021, now allowed, which claims priority under 35 U.S.C. § 119 to U.S. Provisional Application No. 63/260,816, filed on Sep. 1, 2021, each of which is hereby incorporated by reference herein in its entirety.

FIELD OF THE INVENTION

The present invention relates generally to a liquid cooling system for computer devices, and more specifically, to controlling liquid cooling system leaks in server devices disposed in a server rack.

BACKGROUND OF THE INVENTION

Typical server rack systems are configured to house servers and other components. Each of these components generates heat when operational. The combined heat generated by the servers and the other components increases the overall temperature of the components in the server rack, the temperature of the server rack, and the environment surrounding the server rack. This increase in temperature leads to a reduction in the efficiency of the individual servers and the components contained therein.

A conventional approach for reducing the temperature in a server rack includes the use of liquid cooling. Coolant is circulated in a liquid loop including a pump where heat is transferred from a higher temperature heat-generating device to a lower temperature heat sink. The transfer of heat is achieved by contact with an intermediate thermal contact structure. The heat is then transferred via the liquid loop and exhausted to ambient air by a heat exchanger. The pump for the liquid cooling loop typically operates continuously to minimize overheating of heat-generating devices. Thus, a coolant leak causes coolant to accumulate in the server rack until there is no more coolant remaining in the liquid loop. The use of a liquid cooling system is therefore generally not reliable for maintaining a desired temperature for a server rack system, or any of the components therein, because of leaks.

Accordingly, there is a need for improved control of liquid cooling systems and methods to maintain a desired temperature for a server rack system including the heat-generating components therein such as server devices.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a liquid cooling system for computing devices in a rack is disclosed. The liquid cooling system comprises a thermal contact structure, a hot rack manifold, a cool rack manifold, a first valve, a second valve, a leak detection sensor, and a control system. The thermal contact structure is for one of a plurality of heat-generating computer systems housed in a rack. The hot rack manifold and the cool rack manifold are connected via a closed liquid conveyance system to the thermal contact structure. The first valve is positioned within the closed liquid conveyance system between the hot rack manifold and the thermal contact structure. The first valve controls flow of cooling liquid out of the thermal contact structure to the hot rack manifold. The second valve is positioned within the closed liquid conveyance system between the cool rack manifold and the thermal contact structure. The second valve controls flow of cooling liquid into the thermal contact structure from the cool rack manifold. The liquid leak detection sensor is positioned at a first one of the plurality of heat-generating computer systems below the closed liquid conveyance system. The control system is electrically connected to the liquid leak detection sensor, the first valve, and the second valve. The control system includes one or more processors and is coupled to a memory that stores machine readable instructions. When executed on the one or more processors, the instructions implement actions comprising: (i) determining if an electrical signal was received from the liquid leak detection sensor indicative of a leak in the closed fluid conveyance system, (ii) in response to determining a received electrical signal is indicative of a leak, switching off power to the first one of the plurality of heat-generating computer systems, and (iii) in response to determining the received electrical signal is indicative of a leak, transmitting one or more electrical signals to implement moving the first valve and the second valve from open positions to closed positions. The movement of the valves limits movement of cooling liquid along the closed fluid conveyance system from the hot rack manifold and from the cool rack manifold.

In a further aspect, the liquid cooling system further includes a heat exchanger connected to the hot rack manifold and the cool rack manifold via the closed liquid conveyance system. In a further aspect, the liquid cooling system includes a coolant distribution unit comprising one or more pumps for conveying the cooling liquid received from the heat exchanger to the cool rack manifold and to the thermal contact structure via the closed liquid conveyance system. In a further aspect, the cooling liquid is conveyed from the thermal contact structure back to the hot rack manifold and to the heat exchanger.

In a further aspect, the liquid cooling system includes a second thermal contact structure, a third valve, and a fourth valve. The second thermal contact structure is for a second one of the plurality of heat-generating computer systems housed in the rack. The hot rack manifold and the cool rack manifold are connected via the closed liquid conveyance system to the second thermal contact structure. A third valve is positioned within the closed liquid conveyance system between the hot rack manifold and the second thermal contact structure. The third valve controls flow of cooling liquid out of the thermal contact structure to the hot rack manifold. The fourth valve is positioned within the closed liquid conveyance system between the cool rack manifold and the second thermal contact structure. The fourth valve controls flow of cooling liquid into the thermal contact structure from the cool rack manifold.

In a further aspect, the liquid cooling system includes a second liquid leak detection sensor positioned along a base of a housing of the second one of the plurality of computer systems below the closed liquid conveyance system. The control system is further electrically connected to the second liquid leak detection sensor, the third valve, and the fourth valve. The control system is coupled to the memory storing machine readable instructions that when executed on the one or more processors implement actions further comprising (iv) determining if an electrical signal was received from the second liquid leak detection sensor indicative of a leak in the closed fluid conveyance system, (v) in response to determining a received electrical signal is indicative of a leak, switching off power to the second one of the plurality of computer systems, and (vi) in response to determining the received electrical signal is indicative of a leak, transmitting one or more electrical signals to implement moving the third valve and the fourth valve from an open position to a closed position, thereby limiting movement of cooling liquid along the fluid conveyance system from the hot rack manifold and the cool rack manifold.

In a further aspect, the thermal contact structure, the hot rack manifold, the cool rack manifold, the first valve, the second valve, the liquid leak detection sensor, and the controller are housed within the rack. In yet a further aspect, the controller is a baseboard management controller. In yet another aspect, the cooling liquid is one of pure water, ethylene glycol, propylene glycol, or combinations thereof.

In a further aspect, the control system is further configured to transmit an alarm signal for initiating a human-perceptible indication of a detected leak. In yet a further aspect, in response to determining the received electrical signal is indicative of a leak, the liquid cooling system continues to cool the plurality of heat-generating computer systems other than the first one of the plurality of heat-generating computer systems and the plurality of heat-generating computer systems other than the first one of the plurality of heat-generating computer systems continue to receive power.

According to certain aspects of the present disclosure, a method for controlling liquid cooling system leaks in a server rack is disclosed. The server rack includes a plurality of servers. The method comprises monitoring a plurality of leak detection sensors each positioned along a corresponding base of a corresponding one of the plurality of servers and below a corresponding section of a liquid conveyance system. A determination is made if a signal indicative of a leak in the liquid conveyance system was received from one of the plurality of leak detection sensors. In response to determining a received signal indicates a leak, a determination is made which of the corresponding one of the plurality of servers and leak detection sensors is associated with the received signal. In response to determining the corresponding one of the plurality of servers associated with the received signal, power is disconnected to the corresponding one of the plurality of servers. In response to determining the corresponding one of the plurality of servers associated with the received signal, one or more signals are transmitted to implement moving a first valve and a second valve from open positions to closed positions. The first valve is positioned within the liquid conveyance system between a hot rack manifold and a thermal contact structure associated with the one of the plurality of servers associated with the received signal. The second valve is positioned within the liquid conveyance system between a cool rack manifold and the thermal contact structure, thereby limiting movement of cooling liquid along the fluid conveyance system from the hot rack manifold and the cool rack manifold.

In a further aspect, cooling liquid is conveyed through the liquid conveyance system using a coolant distribution unit. In a further aspect for controlling liquid cooling system leaks, an alarm signal is transmitted for initiating a human-perceptible indication of a detected leak. In a further aspect, the cooling liquid is pure water, ethylene glycol, propylene glycol, or combinations thereof. In a further aspect, in response to determining the received signal is indicative of a leak, the liquid cooling system continues to monitor the plurality of leak detection sensors. In yet a further aspect, in response to determining the corresponding one of the plurality of servers associated with the received signal, power to the plurality of servers other than the corresponding one of the plurality of servers is continued.

According to certain aspects of the present disclosure, a rack system is disclosed. The rack system includes a plurality of computing devices and a liquid cooling system. The liquid cooling system includes a plurality of leak detection sensors, a first valve, a second valve, and a controller. The plurality of leak detection sensors are each positioned at a corresponding one of the plurality of computing device below a section of a liquid conveyance system. The first valve is positioned within the liquid conveyance system between a hot rack manifold and a thermal contact structure associated with one of the plurality of computing devices. The second valve is positioned within the liquid conveyance system between a cool rack manifold and the thermal contact structure. The controller is connected to the plurality of liquid leak detection sensors, the first valve, and the second valve. The controller is configured to monitor the plurality of leak detection sensors and determine if a signal was received from one of the plurality of leak detection sensors indicative of a leak in the liquid conveyance system. In response to determining a received signal is indicative of a leak, the controller determines the leak detection sensor and the corresponding one of the plurality of computing devices associated the received signal. In response to determining the corresponding one of the plurality of computing devices associated with the received signal, the controller transmits a signal to disconnect power to the corresponding one of the plurality of computing devices. In response to determining the corresponding one of the plurality of computing devices associated with the received signal, the controller transmits one or more signals to implement moving the first valve and the second valve from open positions to closed positions.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The present disclosure, and its advantages, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
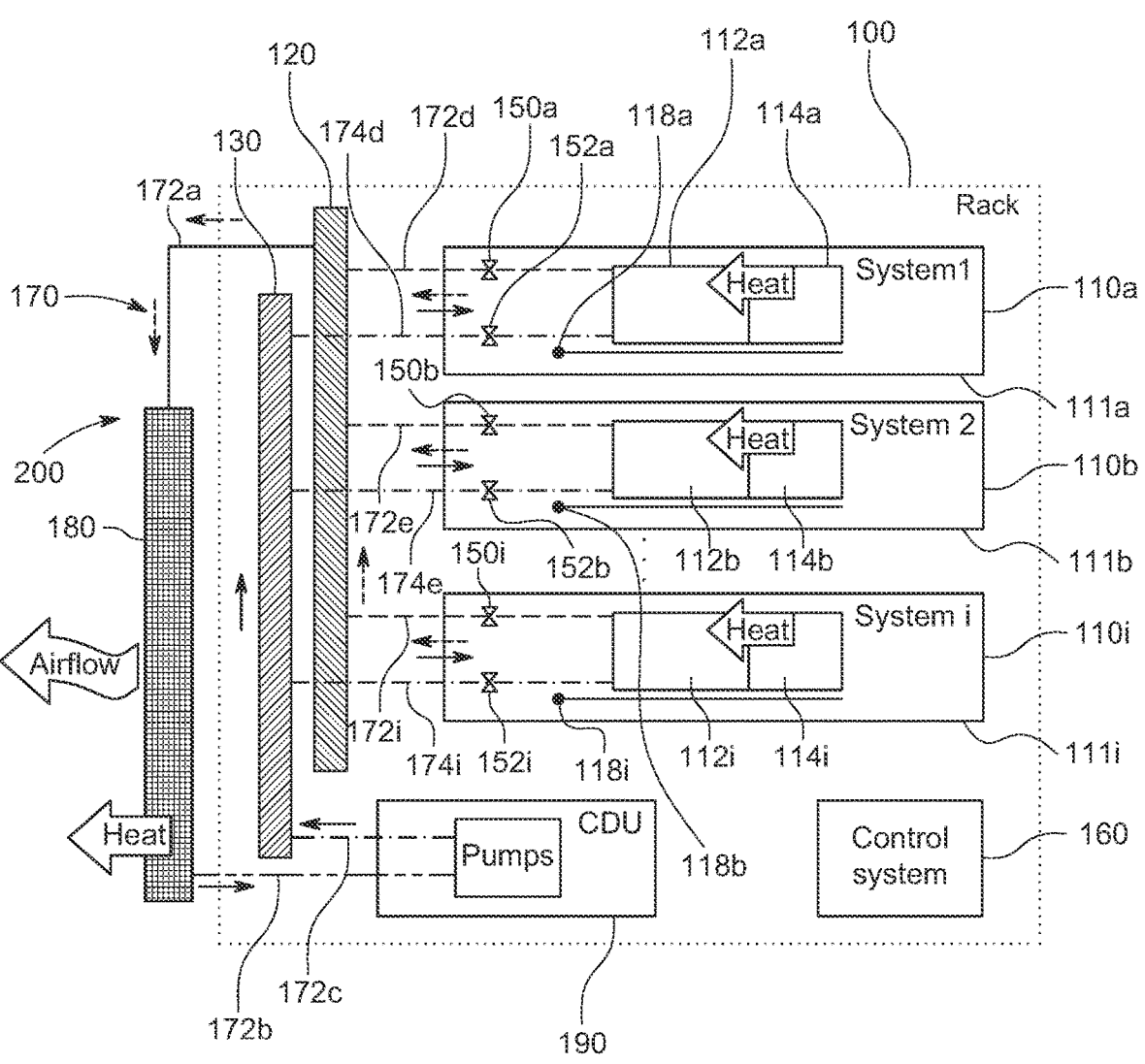
FIG. 1 is a diagram of a server rack including a normally operating liquid cooling system with leak detectors, according to some implementations of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

For the present disclosure, the term "computer system" or "computer device" or "server device" or "server" refers to any electronically-powered or battery-powered equipment that has hardware, software, and/or firmware components, where the software and/or firmware components can be configured for operating features on the device. Without limitation, the equipment can include servers, storage devices, switches, and the like.

Liquid cooling systems for servers, or other heat-generating components, in a rack system can use coolant to remove heat generated by the electronic components. The coolant flows with the assistance of a coolant distribution unit (CDU) within a liquid conveyance system. The coolant flows through a thermal contact structure, such as a cold plate, and through cool rack and hot rack manifolds. The coolant then flows to a heat exchanger (or radiator or chiller) that cools the coolant that has increased in temperature after being exposed to the heat radiating from the heat-generating components. The CDU can include one or more pumps and the liquid conveyance system can include a series of pipes or tubes that carry the coolants to and from the various components of the liquid cooling system. In some implementations, the cooling liquid or coolant can be pure water, ethylene glycol, propylene glycol, or combinations thereof.

During normal server rack operations, the one or more pumps of the CDU operate continuously to provide the force needed to cause flow within the liquid cooling system to continuously distribute coolant to each thermal contact structure in the rack system, such as a cold plate. As discussed in more detail in the context of exemplary FIGS. 1 to 4, a desirable aspect of the present liquid cooling system and method is detecting leak events that can occur in a rack system. The present disclosure can isolate the heat-generating device (e.g., server device, computer device) being cooled from the other heat-generating components in the server rack.

When a leak occurs in the liquid conveyance sections (e.g., pipes or tubes) going into or coming out of the thermal contact structure adjacent to the heat generating device, the flow of coolant in the liquid conveyance section is stopped by the liquid conveyance section being closed off from the remaining liquid cooling system. This is particularly desirable because if the coolant leak is not isolated, the one or more pumps of the CDU continue circulating coolant and would otherwise flow through the holes in the liquid conveyance system and accumulate in the chassis of the rack, or the chassis of the individual servers in the rack. The leaking would continue until all of the coolant runs out of the liquid cooling system. This could be particularly detrimental to the operation of the heat-generating components. Furthermore, if maintenance is required to repair portions of the system where the leak is occurring, pumps typically need to be turned off until the coolant no longer circulates in the liquid conveyance system meaning all of the server or other heat-generating systems in the rack are shut down until the leak repair can be completed. By disconnecting the liquid conveyance section that is leaking from the remaining liquid conveyance system, the present disclosure allows the rack system to otherwise operate normally and minimize shutdown impacts that would otherwise affect the computing performance of a datacenter.

Figure 2:
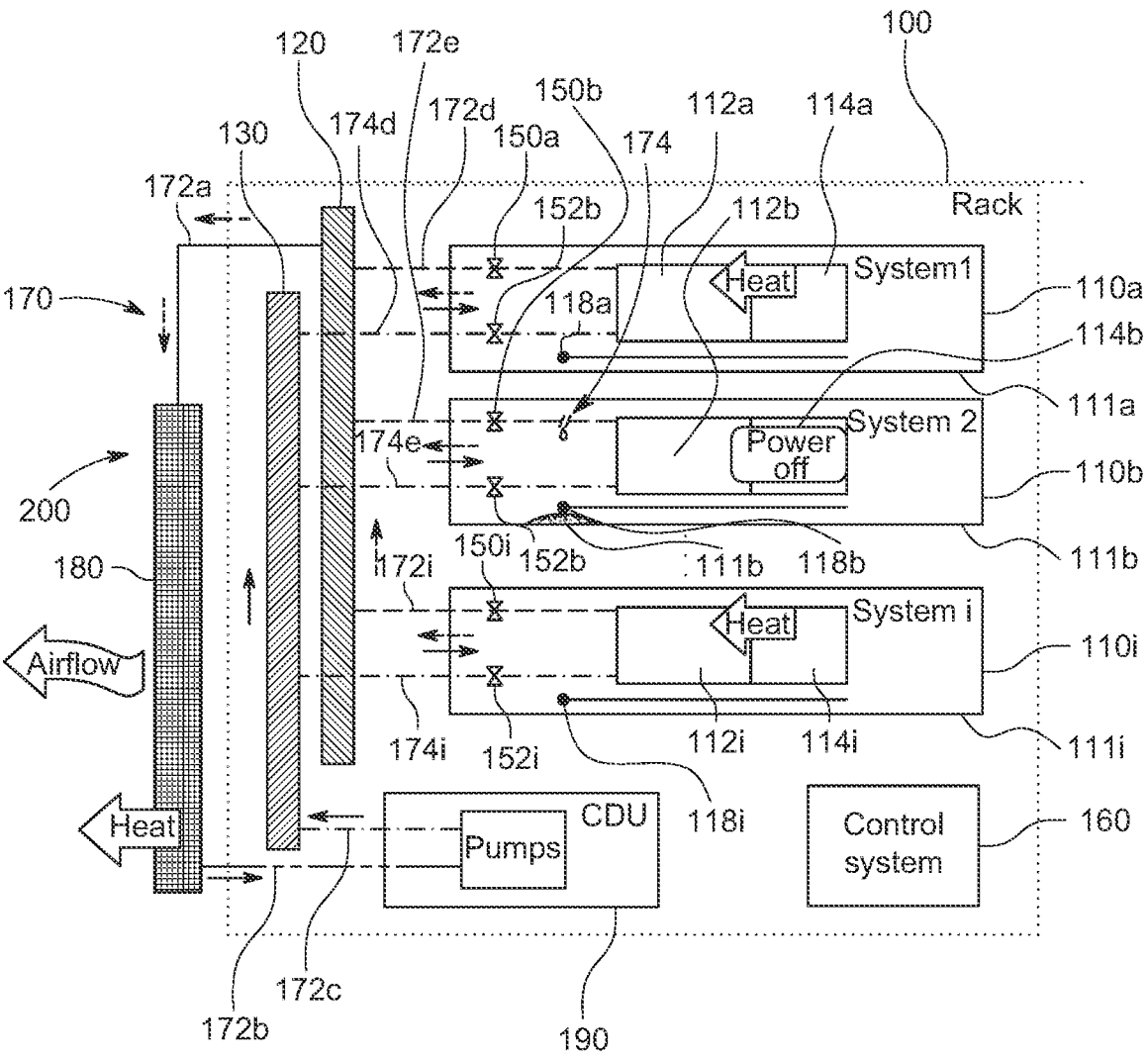
FIG. 2 is a diagram of the server rack of FIG. 1 following the detection of a leak in the liquid cooling system, according to some implementations of the present disclosure.

Turning now to FIGS. 1 and 2, diagrams of a server rack 100, with a plurality of server devices 110a, 110b, 110i, are depicted. FIG. 1 depicts including a normally operating liquid cooling system 200 with liquid leak detection sensors 118a, 118b, 118i and FIG. 2 depicts the server rack 100 following the detection of a leak in the liquid cooling system 200. The liquid cooling system 200 minimizes the leakage of cooling liquid after a liquid cooling system leak is detected using liquid leak detection sensors 118a, 118b, 118i.

Although the devices 110*a*, 110*b*, and 110*i* are servers in this example, the principles therein may be applied to any type of computing device that requires cooling.

The liquid cooling system 200 for the server devices 110*a*, 110*b*, 110*i* in the server rack 100 includes thermal contact structures 112*a*, 112*b*, 112*i* disposed adjacent to corresponding heat-generating components 114*a*, 114*b*, 114*i* within the server devices 110*a*, 110*b*, 110*i*. The liquid cooling system 200 further includes a hot rack manifold 120, a cool rack manifold 130, a plurality of first valves 150*a*, 150*b*, . . . 150*i*, a plurality of second valves 152*a*, 152*b*, . . . 152*i*, liquid leak detection sensors 118*a*, 118*b*, . . . 118*i*, and a control system 160. The liquid cooling system 200 further includes a liquid conveyance system 170 comprising a series of liquid conveyance sections (e.g., pipes, tubes) 172*a*, 172*b*, 172*c*, 172*d*, 172*e*, 172*i*, 174*d*, 174*e*, 174*i* that carry cooling liquid in a closed fluid system into and out of the server rack 100 to a heat exchanger 180 (e.g., radiator, chiller). The cooling liquid is circulated along the liquid conveyance system 170 by a coolant distribution unit 190 that includes one or more pumps.

Each of the thermal contact structures 112*a*, 112*b*, 112*i* are associated with and positioned immediately adjacent to (or near) a corresponding heat-generating component 114*a*, 114*b*, 114*i* of a server device 110*a*, 110*b*, 110*i* housed in the server rack 100. The hot rack manifold 120 is connected via liquid conveyance sections 172*d*, 172*e*, 172*i* of the liquid conveyance system 170 to the thermal contact structures 112*a*, 112*b*, 112*i*. This arrangement allows heated cooling liquid to flow from the thermal contact structures 112*a*, 112*b*, 112*i* into the hot rack manifold 120. Similarly, the cool rack manifold 130 is connected via liquid conveyance sections 174*d*, 174*e*, 174*i* of the liquid conveyance system 170 to thermal contact structures 112*a*, 112*b*, 112*i*. This arrangement allows cooled cooling liquid to flow from the cool rack manifold 130 into the thermal contact structures 112*a*, 112*b*, 112*i*.

Valves 150*a*, 150*b*, 150*i*, 152*a*, 152*b*, 152*i* are positioned along the liquid conveyance sections 172*d*, 172*e*, 172*i*, 174*d*, 174*e*, 174*i*. The valves 150*a*, 150*b*, 150*i*, 152*a*, 152*b*, 152*i* are positioned between either, the hot rack manifold 120 or the cool rack manifold 130, and the corresponding thermal contact structures 112*a*, 112*b*, 112*i*. The valves 150*a*, 150*b*, 150*i*, 152*a*, 152*b*, 152*i* are communicatively connected to the control system 160 so that the valves 150*a*, 150*b*, 150*i*, 152*a*, 152*b*, 152*i* can be monitored and individually positioned in either an open position to independently allow the flow of cooling liquid into and out of the thermal contact structures 112*a*, 112*b*, 112*i* or to a closed position to isolate a particular thermal contact structure, such as when a leak is detected along one of the liquid conveyance sections 172*d*, 172*e*, 172*i*, 174*d*, 174*e*, 174*i*. For example, by opening or closing valve 150*b*, the flow of cooling liquid out of the thermal contact structure 112*b* to the hot rack manifold 120 is controlled. Similarly, by opening or closing the valve 152*b*, the flow of cooling liquid into the thermal contact structure 112*b* from the cool rack manifold 130 is controlled. Such control by valves 150*b*, 152*b* allow the cooling of the server device 110*b* to be isolated in the event of a leak along liquid conveyance sections 172*e*, 174*e*.

Liquid leak detection sensors 118*a*, 118*b*, 118*i* are positioned along a base of a housing 111*a*, 111*b*, 111*i* of each of the server devices 110*a*, 110*b*, 110*i* below the respective liquid conveyance sections 172*d*, 174*d*; 172*e*, 174*e*; 172*i*, 174*i*. The control system 160 is also communicatively connected to the liquid leak detection sensors 118*a*, 118*b*,

118*i* to monitor for any cooling liquid leaks. If a signal is received by the controller system from one of the liquid leak detection sensors 118*a*, 118*b*, 118*i*, the control system 160 will then proceed to close the valves for the heat-generating component associated with the leak detection sensor that transmitted the leak detection signal. For example, in FIG. 2, a leak 174 is depicted in liquid conveyance section 172*e* with cooling liquid accumulating at base of the housing 111*b* triggering the detection of the leak by leak detection sensor 118*b*.

The control system 160, after receiving the signal indicating a leak has been detected, proceeds to send a signal to the server device 110*b* to power down and a signal to the valves 150*b*, 152*b* to move into a closed position. By taking such action, the remaining server devices 110*a*, 110*i* in the server rack 100 continue to operate, while also protecting the server device 110*b*. Such action also minimizes the chance of potential electrical short circuits due to the accumulation of cooling liquid external to the liquid conveyance system 170. Similar actions are contemplated for server devices 110*a*, 110*i* should more than one leak occur or should the leak be detected that is associated with a different server device.

The control system 160 includes one or more processors and is coupled to a memory having stored thereon machine readable instructions. Upon execution of the machine readable instructions, the control system 160 implements actions including first determining if a signal indicative of a leak in the liquid conveyance system 170 was received from liquid leak detection sensors 118*a*, 118*b*, 118*i*. In particular, determination of leaks in fluid conveyance sections 172*d*, 174*d*, 172*e*, 174*e*, 172*i*, 174*i* may be determined based on the sensor signals. In response to determining a received signal is indicative of a leak, a signal is transmitted from the control system 160 to switch power off to the server device that is experiencing the leak (e.g., server device 110*b* for the leak depicted in FIG. 2). In response to determining the received signal is indicative of a leak, one or more signals (in the example of FIG. 2) are then also transmitted to implement moving the valves 150*b*, 152*b* from open positions to closed positions. The closing of the valves limits movement of cooling liquid along the liquid conveyance system 170 to the hot rack manifold 120 and from the cool rack manifold 130.

The liquid cooling system 200 further includes a heat exchanger 180 in fluid connection with the hot rack manifold 120 and the cool rack manifold 130 via liquid conveyance sections 172*a*, 172*b*. The cooling liquid flows from the hot rack manifold 120 where heated cooling liquid is received to the heat exchanger 180. The cooling liquid is cooled by air flow through the heat rack manifold 120, which removes the accumulated heat in the cooling liquid. The cooled cooling liquid is then circulated to the cool rack manifold 130 before being conveyed to the thermal contact structures 112*a*, 112*b*, 112*i* to continue the cycle of removing generated heat from the heat-generating devices 114*a*, 114*b*, 114*i*.

The circulation of the cooling liquid is caused by the coolant distribution unit 190, which has one or more pumps for conveying the cooling liquid received from the heat exchanger 180 to the cool rack manifold 130. From the cool rack manifold 130, the cooling liquid is circulated to the thermal contact structures 112*a*, 112*b*, 112*i* and again eventually back to the heat exchanger 180 after passage through the hot rack manifold 120.

In some implementations, the thermal contact structures 112*a*, 112*b*, 112*i*, the hot rack manifold 120, the cool rack manifold 130, the liquid conveyance sections 172*d*, 174*d*, 172e, 174e, 172i, 174i, the valves 150a, 152a, 150b, 152b, 150i, 152i, the liquid leak detection sensors 118a, 118b, 118i, and the control system 160 are all housed within the server rack 100, as depicted in FIGS. 1 and 2. In some implementations, one or more of the hot rack manifold 120, the cool rack manifold 130, or the controller system 160, are positioned outside of the server rack 100.

In some implementations, the control system 160 can be a baseboard management controller (BMC) or rack management controller (RMC). The BMC can be a small computer positioned on the motherboard of one of the server devices 110a, 110b, 110i or may be a separate entity disposed somewhere within or outside of the server rack 100. The BMC can have the control logic built into the controller for controlling the valves 150a, 150b, 150i, 152a, 152b, 152i, for controlling power to the server devices 110a, 110b, 110i, and for controlling the liquid leak detection sensors 118a, 118b, 118i, among other possible controller operations. Alternatively, a RMC may be installed on a backplane for the rack. The RMC can monitor the leak detection sensors and control the valves for the entire rack.

In some implementations, the control system 160 is configured to transmit an alarm signal for initiating a human-perceptible indication when a leak is detected, such as a visual indication or a sound. The transmitted signal could also or alternatively include transmitting a message to a smartphone or computing device that may trigger additional actions. Another desirable implementation is that the liquid cooling system 200 continues to cool the plurality of heat-generating devices (e.g., 114a, 114i) other than the one(s) (e.g., 114b) associated with a leak as part of the response to a leak having been identified. In addition, the plurality of heat-generating devices other than the one associated with the leak continue to receive power to maintain normal server rack operations.

Figures 3A, 3B:
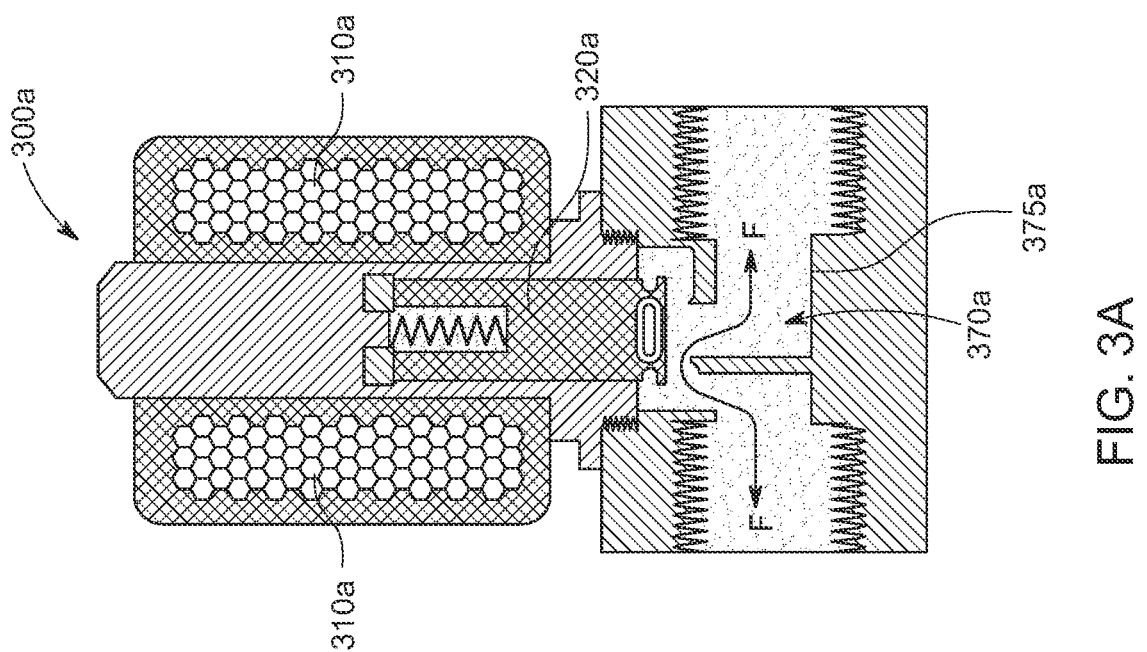
FIGS. 3A and 3B are exemplary valves in a liquid conveyance system of the liquid cooling system, according to some implementations of the present disclosure.

Referring now to FIGS. 3A and 3B, exemplary cross-sections of valves 300A, 300B are depicted that may be used in the liquid conveyance system 170 depicted in FIGS. 1 and 2. For example, the valves 300a, 300b can be used as any of the valves 150a, 150b, 150i, 152a, 152b, 152i in FIGS. 1 and 2. Valves 300a, 300b are solenoid valves that can be directly operated (e.g., 300a) or indirectly operated (e.g., 300b). Both valves include a coil 310a, 310b and are depicted in an open state that allows cooling liquid 370a, 370b to flow along path F-F and F'-F' through the liquid conveyance section 375a, 375b, similar to liquid conveyance sections 172d, 172e, 172i, 174d, 174e, 174i depicted in FIGS. 1 and 2. Valve 300a can be moved to the closed position by energizing the coil 310a to move plunger 320a in a downward direction. Valve 300b can be similarly closed by energizing the coil 310b to move plunger 320b in a downward direction, except given the indirect operability of valve 300b, where pressure differentials also provide for the plunger 320b to move to the closed position. Similar to the discussion for FIGS. 1 and 2, the valves 300a, 300b are controlled by control system 160 (see FIGS. 1 and 2) that transmits signals to cause the solenoid valves to close and open.

Figure 4:
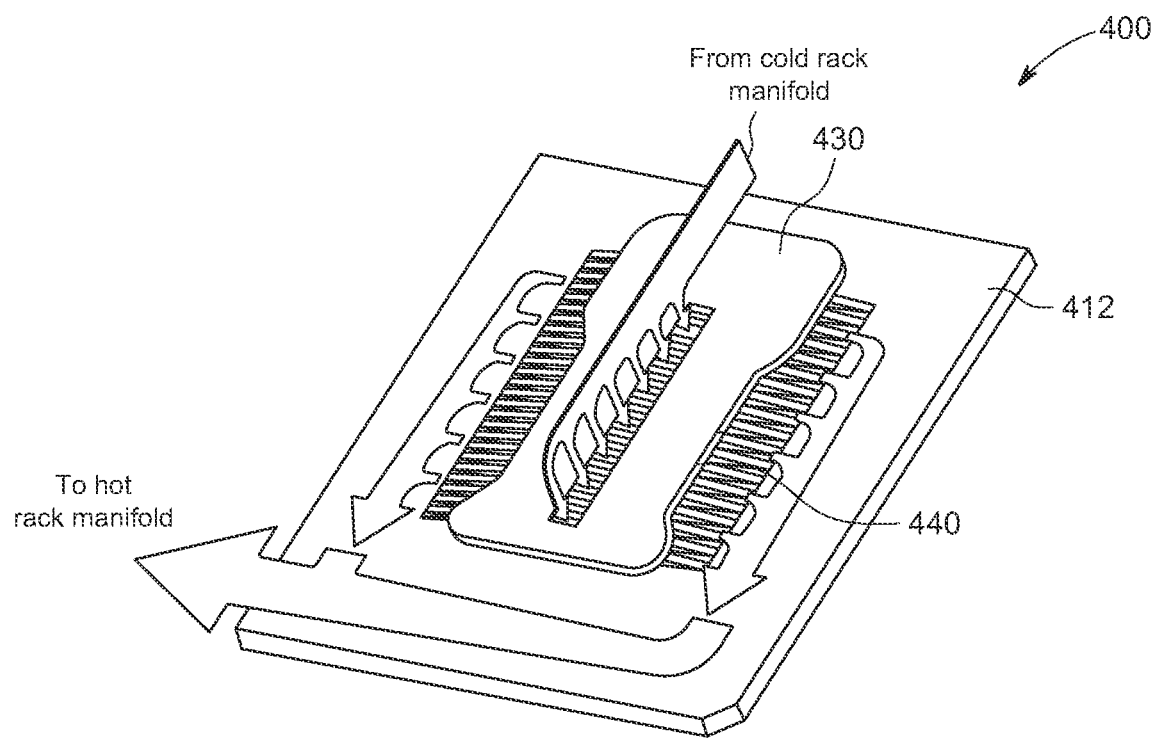
FIG. 4 is a thermal contact structure for a liquid cooling system, according to some implementations of the present disclosure.

Referring now to FIG. 4, an exemplary thermal contact structure 400 including a cold plate 412 is depicted for a liquid cooling system (e.g., liquid cooling system 200 from FIGS. 1 and 2). The thermal contact structure 400 includes a cold plate 412 and a manifold 430 positioned above a series of microchannels 440 in the cold plate 412. The cooling liquid flows from a cold rack manifold (not shown, but similar to cool rack manifold 130 from FIGS. 1 and 2) and flows into the series of microchannels 440 through the manifold 430 of the cold plate 412. The cooling liquid then flows out of the microchannels 440 and exits the cold plate 412 flowing from the thermal contact structure 400 to a hot rack manifold (not shown, but similar to hot rack manifold 120 from FIGS. 1 and 2).

Figure 5:
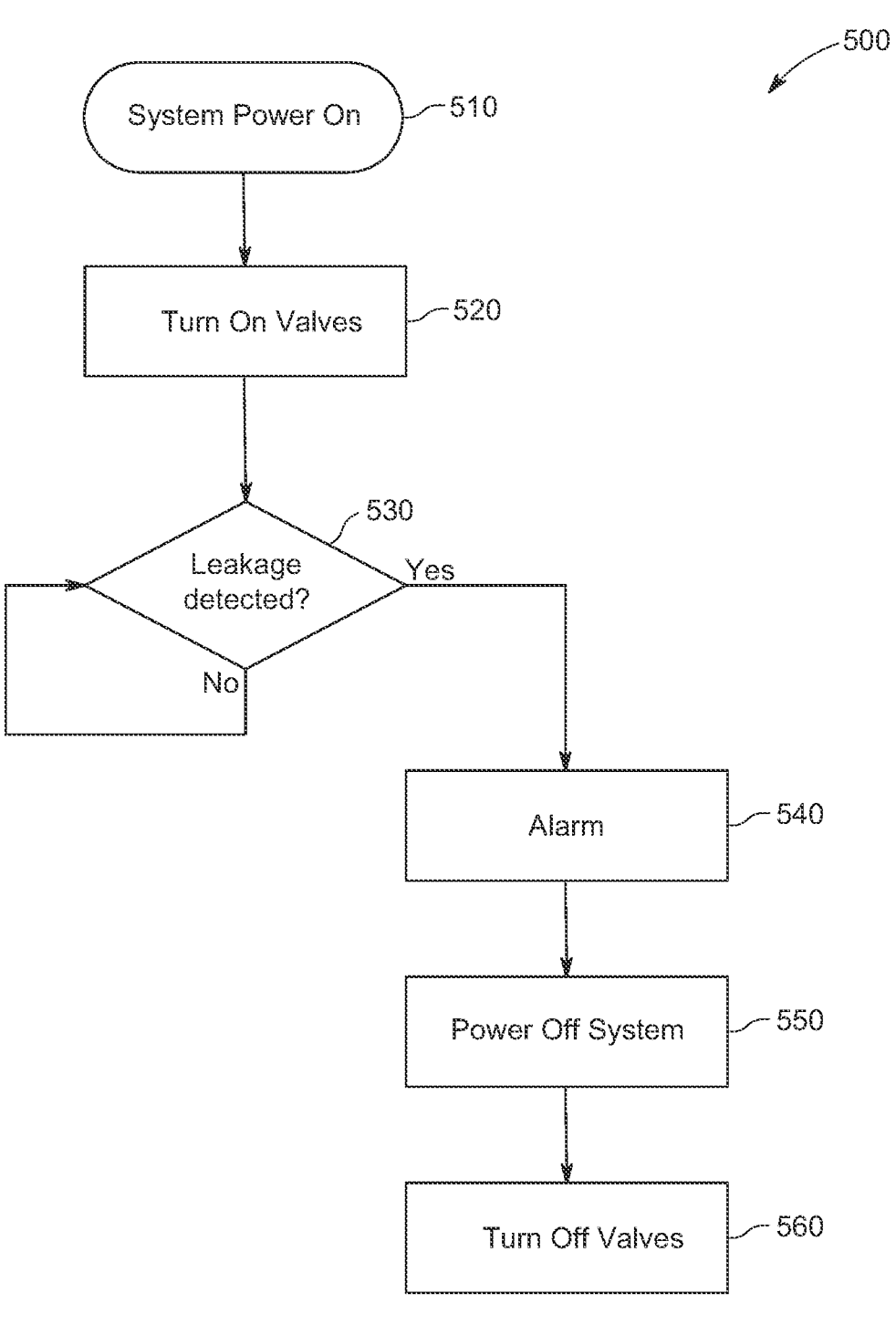
FIG. 5 is a flow diagram for a method of controlling liquid cooling system leaks, according to some implementations of the present disclosure.

Referring now to FIG. 5, a flow diagram 500 is depicted for a method of controlling liquid cooling system leaks in heat-generating device in a server rack. In some aspects, the actions of FIG. 5 can be applied using the devices depicted in FIGS. 1 to 4. As a preliminary step of the method, a server rack is powered on at step 510 and the liquid conveyance sections of the heat-generating devices are monitored for potential leaks. Next, in some implementations, at step 520 the valves positioned along the liquid conveyance system, such as exemplary solenoid valves 300a, 300b from FIG. 3, are energized and placed into the open state to allow cooling liquid to flow through the rack and provide cooling for the heat-generating devices.

Next at step 530, during normal operations of the liquid cooling system, a plurality of leak detection sensors is monitored. The leak detection sensors are positioned along corresponding bases of the heat-generating devices (e.g., server devices). The leak detection sensors are also positioned below liquid conveyance sections entering and exiting the thermal contact structures adjacent to the heat-generating devices. A determination is made if a signal was received from one of the plurality of leak detection sensors indicative of a leak in the liquid conveyance system. If no signal is received, step 530 remains in a monitoring loop. In response to determining a received signal is indicative of a leak, the method proceeds to step 540 where in some implementations an alarm signal may be generated or transmitted to provide an alert of the leak condition. Also, in response to determining a received signal is indicative of a leak, a determination of which leak detection sensor and corresponding heat-generating or server device is associated with the received signal.

Next, at step 550, in response to determining the heat-generating or server device associated with the received signal, power is disconnected to that heat-generating or server device. Then, at step 560, in response to determining the heat-generating or server device associated with the received signal, one or more signals are transmitted from the controller system to implement the moving of valves along liquid conveyance sections entering and exiting the thermal contact structures from open positions to closed positions. One of the valves is positioned within the liquid conveyance system between a hot rack manifold and a thermal contact structure associated with heat-generating or server device that received the signal. A second one of the valves is positioned within the liquid conveyance system between a cool rack manifold and the thermal contact structure for the same heat-generating or server device. The closing of the valves limits movement of cooling liquid along the fluid conveyance system to the hot rack manifold and from the cool rack manifold.

In some implementations of the method, in response to determining the received signal is indicative of a leak, the liquid cooling system continues to monitor the plurality of leak detection sensors. In yet a further implementation of the method, in response to determining the heat-generating or server device that is associated with the received signal, power is continued to the remaining heat-generating devices (e.g., servers) other than the heat-generating or server device associated with the received signal.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A method for controlling liquid cooling system leaks in a server rack including a plurality of servers, the method comprising:

monitoring a plurality of leak detection sensors each positioned at a corresponding one of the plurality of servers below a section of a liquid conveyance system;

determining if a signal was received from one of the plurality of leak detection sensors indicative of a leak in the liquid conveyance system;

in response to determining a received signal is indicative of a leak, determining a corresponding one of the plurality of leak detection sensors and a corresponding one of the plurality of servers associated with the received signal;

in response to determining the corresponding one of the plurality of servers associated with the received signal, disconnecting power to the corresponding one of the plurality of servers; and in response to determining the corresponding one of the plurality of servers associated with the received signal, transmitting one or more signals to implement moving a first valve and a second valve from open positions to closed positions to isolate the corresponding one of the plurality of servers from a remaining portion of the liquid conveyance system;

wherein the first valve is positioned within the liquid conveyance system between a hot rack manifold and a thermal contact structure associated with the one of the plurality of servers associated with the received signal, the hot rack manifold being directly connected to the first valve for providing a return flow of heated cooling liquid from the thermal contact structure;

wherein the second valve is positioned within the liquid conveyance system between a cool rack manifold and the thermal contact structure, thereby limiting movement of cooling liquid along the liquid conveyance system from the hot rack manifold and from the cool rack manifold, the cool rack manifold being directly connected to the second valve and being located between the cool rack manifold and the plurality of servers;

wherein each server of the plurality of servers has a housing enclosing a heat-generating computing system, the thermal contact structure, the first valve, the second valve, and the corresponding one of the plurality of leak detection sensors; and wherein, in response to determining the corresponding one of the plurality of servers associated with the received electrical signal, the liquid conveyance system continues to cool the plurality of servers other than the corresponding one of the plurality of servers, and the plurality of servers other than the corresponding one of the plurality of servers continue to receive power.

2. The method of claim 1, wherein cooling liquid is conveyed through the liquid conveyance system using a coolant distribution unit.

3. The method of claim 1, further comprising transmitting an alarm signal for initiating a human-perceptible indication of a detected leak.

4. The method of claim 1, wherein the cooling liquid is pure water, ethylene glycol, propylene glycol, or combinations thereof.

5. The method of claim 1, wherein in response to determining the received signal is indicative of a leak, the liquid cooling system continues to monitor the plurality of leak detection sensors.

6. The method of claim 1, wherein in response to determining the corresponding one of the plurality of servers associated with the received signal, continuing power to the plurality of servers other than the corresponding one of the plurality of servers.

7. The method of claim 1, further comprising providing a heat exchanger connected to the hot rack manifold and the cool rack manifold.

8. The method of claim 7, further comprising conveying, via a coolant distribution unit that includes one or more pumps, the cooling liquid received from the heat exchanger to the cool rack manifold and to the thermal contact structure.

9. The method of claim 8, further comprising conveying the cooling liquid from the thermal contact structure back to the hot rack manifold and to the heat exchanger.

10. The method of claim 1, further comprising providing a control system that is electrically connected to the plurality of leak detection sensors, the first valve, and the second valve, the control system performing one or more of the monitoring, determining, and transmitting steps.

11. A method for controlling a liquid cooling system for a plurality of computing devices in a rack, the method comprising:

providing a plurality of computing devices stacked in the rack, each computing device having a housing enclosing a heat-generating computing system, a thermal contact structure, a first valve, a second valve, and a liquid leak detection sensor;

cooling the heat-generating computing system via a thermal contact structure;

controlling, via the first valve, flow of cooling liquid out of the thermal contact structure;

controlling, via the second valve, flow of the cooling liquid into the thermal contact structure;

providing a return flow of heated cooling liquid from the thermal contact structure, the return flow being facilitated via a hot rack manifold being directly connected to the first valve, the hot rack manifold being located between a cool rack manifold and the plurality of computing devices;

supplying, via the second valve, flow of cooled cooling liquid into the thermal contact structure;

determining if an electrical signal was received from the liquid leak detection sensor, the electrical signal being indicative of a leak; and in response to determining that the electrical signal is indicative of the leak, switching off power to a respective heat-generating computing system, and moving the first valve and the second valve of a respective computing device from open positions to closed positions to isolate the respective computing device from a remaining portion of the plurality of computing devices stacked in the rack, thereby limiting movement of the cooling liquid from the hot rack manifold and into the cool rack manifold;

wherein, in response to determining the respective computing device associated with the leak, the cooling continues to heat-generating computing systems of the plurality of computing devices other than the corresponding computing device, and each heat-generating computing system of the plurality of computing devices other than the respective heat-generating computing system continues to receive power.

12. The method of claim 11, further comprising providing a heat exchanger connected to the hot rack manifold and the cool rack manifold.

13. The method of claim 12, further comprising conveying, via a coolant distribution unit that includes one or more pumps, the cooling liquid received from the heat exchanger to the cool rack manifold and to the thermal contact structure.

14. The method of claim 13, further comprising conveying the cooling liquid from the thermal contact structure back to the hot rack manifold and to the heat exchanger.

15. The method of claim 11, further comprising providing a control system that is electrically connected to the liquid leak detection sensor, the first valve, and the second valve, the control system performing one or more of the determining, switching, and moving steps.

16. The method of claim 15, further comprising providing the control system in the form of a baseboard management controller.

17. The method of claim 11, further comprising providing the cooling liquid in the form of pure water, ethylene glycol, propylene glycol, or combinations thereof.

18. The method of claim 11, further comprising transmitting an alarm signal for initiating a human-perceptible indication of the leak.

19. The method of claim 11, further comprising continuing power to one or more heat-generating computing systems of the plurality of computing devices other than to the respective heat-generating computing system.

20. The method of claim 11, further comprising monitoring one or more liquid leak detections sensors of the plurality of computing devices after receiving the electrical signal that is indicative of the leak.

* * * * *